(12) United States Patent
Kim

(10) Patent No.: US 10,777,558 B1
(45) Date of Patent: Sep. 15, 2020

(54) CMOS-BASED INTEGRATED CIRCUIT PRODUCTS WITH ISOLATED P-WELLS FOR BODY-BIASING TRANSISTOR DEVICES

(71) Applicant: GLOBALFOUNDRIES Inc., Grand Cayman (KY)

(72) Inventor: Juhan Kim, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/352,420

(22) Filed: Mar. 13, 2019

(51) Int. Cl.
*H01L 29/06* (2006.01)
*H01L 27/092* (2006.01)

(52) U.S. Cl.
CPC ...... *H01L 27/0928* (2013.01); *H01L 29/0653* (2013.01)

(58) Field of Classification Search
CPC .......................... H01L 27/0928; H01L 29/0653
See application file for complete search history.

(56) References Cited

U.S. PATENT DOCUMENTS

| | | | |
|---|---|---|---|
| 6,218,895 B1 | 4/2001 | De et al. | |
| 6,300,819 B1 | 10/2001 | De et al. | |
| 9,601,511 B2 | 3/2017 | Vinet et al. | |
| 9,923,527 B2 | 3/2018 | McKay | |
| 10,378,967 B1 * | 8/2019 | Vogelsang | G05F 1/562 |

* cited by examiner

*Primary Examiner* — David Vu
(74) *Attorney, Agent, or Firm* — Amerson Law Firm, PLLC

(57) ABSTRACT

One illustrative integrated circuit product disclosed herein comprises a PFET region and an NFET region defined in an active semiconductor layer of an SOI substrate, a deep N-well region positioned in the base semiconductor substrate, first and second isolated P-wells positioned in the base semiconductor substrate below the PFET region and the NFET region, respectively, wherein the first and second isolated P-wells engage the deep N-well region, and a deep isolation structure that extends into the deep N-well region, wherein a first portion of the deep isolation structure is laterally positioned between the first isolated P-well and the second isolated P-well to electrically isolate, in a horizontal direction, the first isolated P-well from the second isolated P-well. The product also includes at least one PFET transistor and at least one NFET transistor.

18 Claims, 7 Drawing Sheets

CMOS-BASED INTEGRATED CIRCUIT PRODUCTS WITH ISOLATED P-WELLS FOR BODY-BIASING TRANSISTOR DEVICES

BACKGROUND

Field of the Disclosure

Generally, the present disclosure relates to various illustrative embodiments of novel CMOS-based integrated circuit (IC) products with isolated P-wells for body-biasing transistor devices.

Description of the Related Art

In modern integrated circuit products, such as microprocessors, storage devices, ASICs and the like, a very large number of circuit elements, especially transistors, are provided on a restricted chip area. The transistors come in a variety of shapes and forms, e.g., planar transistors, FinFET transistors, nanowire devices, etc. The transistors are typically either NFET or PFET type devices wherein the "N" and "P" designation is based upon the type of dopants used to create the source/drain regions of the devices. CMOS circuits include both NFET and PFET transistors.

As performance requirements have increased, the transistors may be formed in and above an SOI (semiconductor-on-insulator) substrate that includes a base semiconductor substrate, a buried insulation layer (sometime referred to as a "BOX" layer when the buried insulation layer comprises silicon dioxide) positioned on the base substrate and an active layer comprised of a semiconducting material positioned on the buried insulation layer. Moreover, such transistors may be formed as fully-depleted (FDSOI) devices wherein the active layer of the SOI substrate, i.e., the channel region of the transistors, is substantially free of dopant materials.

Body-biasing is a technique employed in CMOS circuits to dynamically adjust the threshold voltage of the transistors in the CMOS circuit. Body-biasing (forward biasing and reverse biasing) can be used to beneficially fine tune the performance characteristics of the transistors and the CMOS circuit in terms of both speed performance and power consumption. Unfortunately, the structure and configuration of some CMOS-based circuits may limit the extent to which body-biasing techniques may be used to improve or change the performance characteristics of the transistors in the CMOS circuit.

One illustrative prior art IC product included FDSOI transistors comprising back gates and front gates. More specifically, the IC product included a signal processing unit for processing an input signal so as to provide an output signal. In this example, the signal processing unit includes a first transistor and a second transistor that are operatively coupled to one another. The first transistor comprises a first front gate and a first back gate. The second transistor comprises a second front gate and a second back gate. The first back gate of the first transistor is electrically coupled to the first front gate of the first transistor. The second back gate of the second transistor is electrically coupled to the second front gate of the second transistor. The semiconductor device also includes a gain circuit for providing a gain upon the output signal from the signal processing unit. The product also includes a bias circuit to provide a first bias signal to the first back gate and a second bias signal to the second back gate. In the prior art, the first back gate and the second back gate were P-wells formed in the substrate, wherein the P-wells were isolated, in the horizontal direction, by an N-well region positioned above a deep N-well previously formed in the substrate. The deep N-well positioned below the two horizontally isolated P-wells provided vertical isolation for the P-wells.

The present disclosure is directed to various illustrative embodiments of novel CMOS-based IC products with isolated P-wells for body-biasing transistor devices that may avoid, or at least reduce, the effects of one or more of the problems identified above.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various illustrative embodiments of novel CMOS-based IC products with isolated P-wells for body biasing transistor devices. One illustrative integrated circuit product disclosed herein includes a PFET region and an NFET region defined in an active semiconductor layer of an SOI substrate, a deep N-well region positioned in the base semiconductor substrate, first and second isolated P-wells positioned in the base semiconductor substrate below the PFET region and the NFET region, respectively, wherein the first and second isolated P-wells engage the deep N-well region and a deep isolation structure that extends into the deep N-well region, wherein a first portion of the deep isolation structure is laterally positioned between the first isolated P-well and the second isolated P-well to electrically isolate, in a horizontal direction, the first isolated P-well from the second isolated P-well. In this example, the product also includes at least one PFET transistor formed on the PFET region and above the first isolated P-well as well as at least one NFET transistor formed on the NFET region and above the second isolated P-well. The arrangement permits the controlling of the threshold voltages of the transistors by applying appropriate voltages to the first and second isolated P-wells.

BRIEF DESCRIPTION OF THE DRAWINGS

The disclosure may be understood by reference to the following description taken in conjunction with the accompanying drawings, in which like reference numerals identify like elements, and in which.

DETAILED DESCRIPTION

Figure 1:
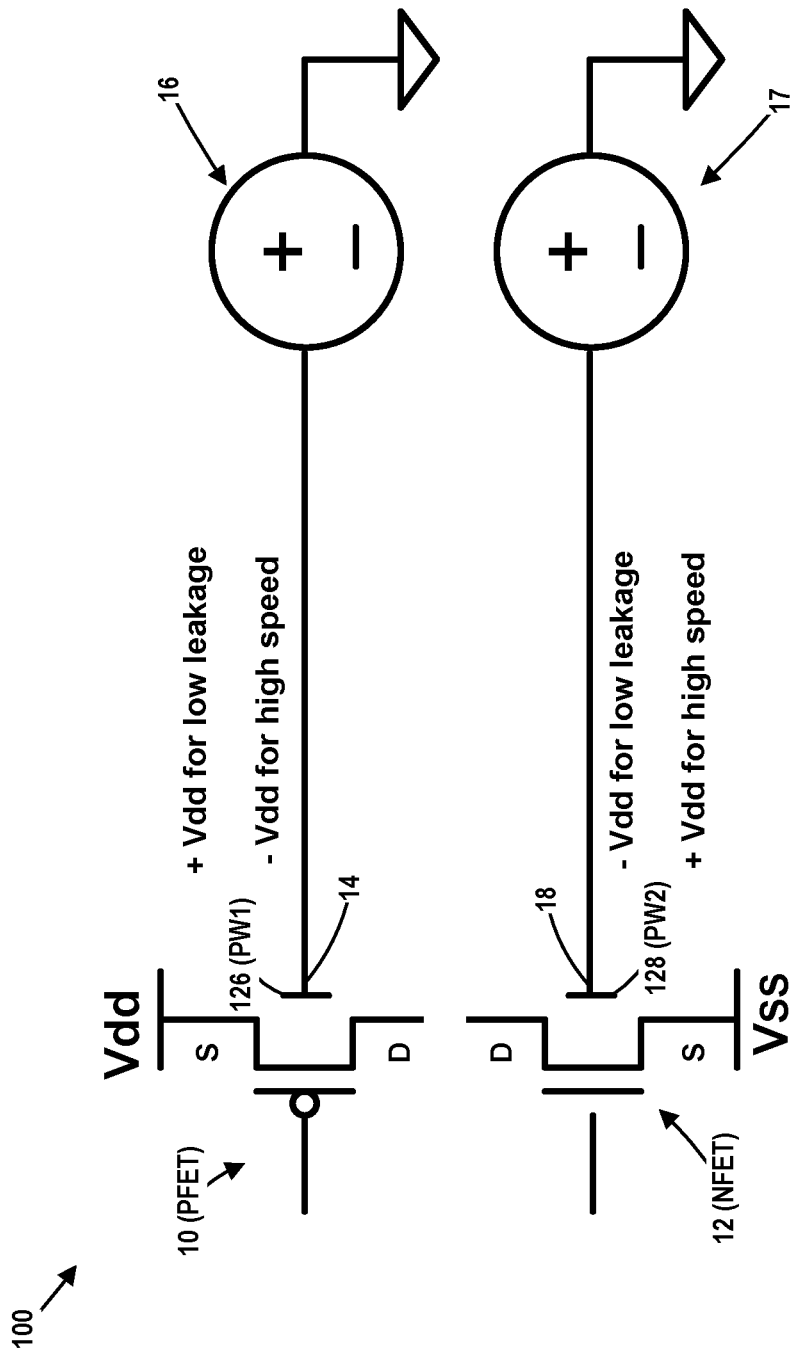
FIGS. 1-7 depict various illustrative embodiments of novel CMOS-based IC products with isolated P-wells for body-biasing transistor devices. The drawings herein are not to scale While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the methods disclosed herein may be employed in manufacturing a variety of different devices, including, but not limited to, logic devices, memory devices, etc. As will also be appreciated by those skilled in the art after a complete reading of the present application, various doped regions, e.g., source/drain regions, halo implant regions and the like, are not depicted in the attached drawings. The drawings are not to scale. Of course, the inventions disclosed herein should not be considered to be limited to the illustrative examples depicted and described herein. The various components and structures of the devices and integrated circuit products disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2:
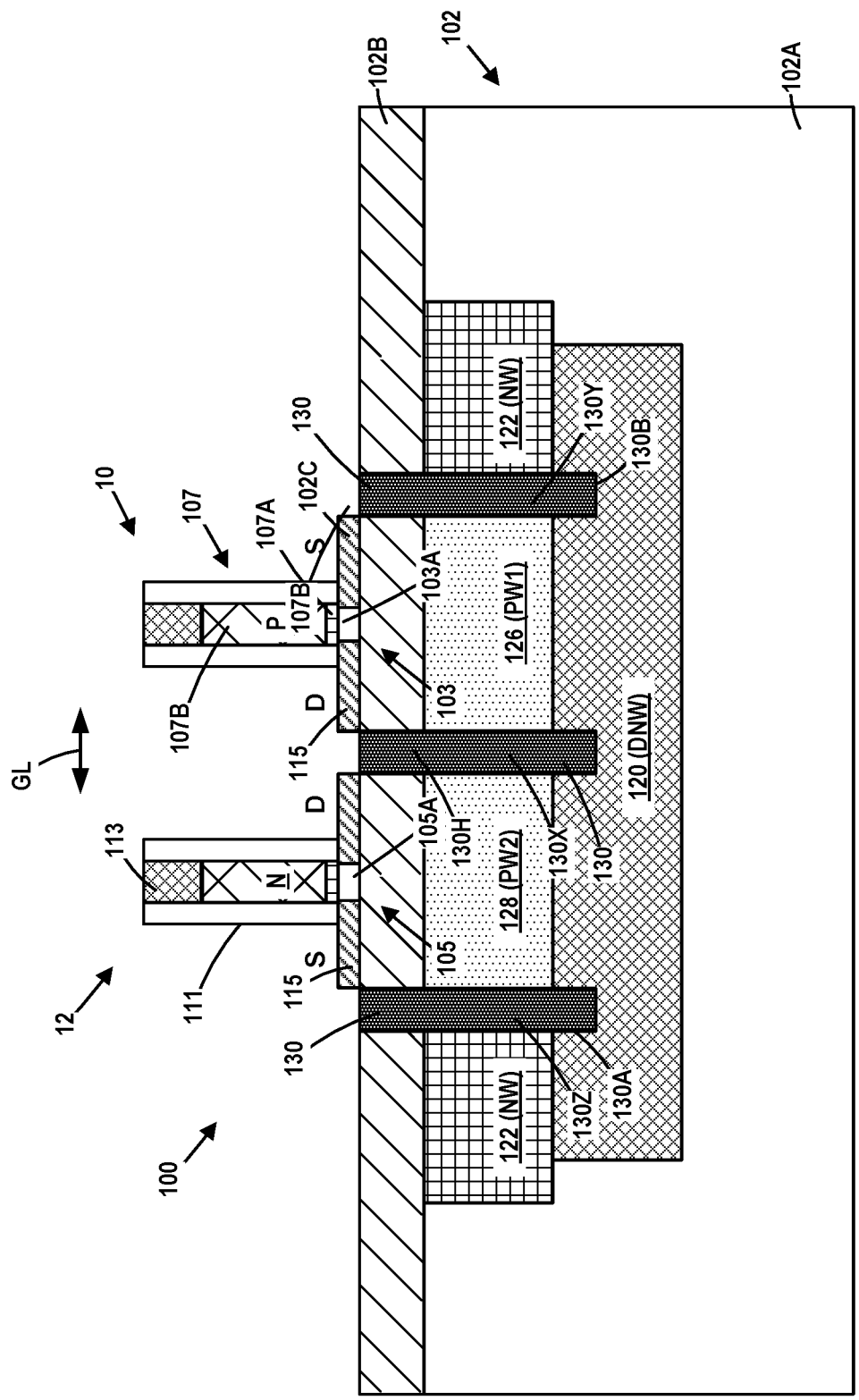

FIGS. 1-5 depict various illustrative embodiments of a novel CMOS-based IC product 100 with isolated P-wells for body-biasing transistor devices. The product 100 will be formed on an illustrative SOI (semiconductor-on-insulator) structure or substrate 102. FIG. 1 is a simplistic layout of a CMOS-based IC product 100 that includes at least one illustrative PFET transistor 10 and at least one illustrative NFET transistor 12. With reference to FIG. 2, a deep isolation structure 130 was formed in the substrate 102 to define separate active regions in the active semiconductor layer 102C where the transistor devices 10, 12 will be formed. As shown in the depicted example, the substrate 102 comprises a PFET region 103 with a channel region 103A (where the at least one PFET device 10 will be formed) and an NFET region 105 with a channel region 105A (where the at least one NFET device 12 will be formed). Each of the illustrative transistors 10, 12 have a drain region ("D") and a source region ("S"). The source region of the PFET transistor 10 is connected to a high positive reference potential, e.g., Vdd, while the drain region of the PFET transistor 10 is connected to a load. The source region of the NFET transistor 12 is connected to a lower reference potential, Vss (or ground), while the drain region of the NFET transistor 12 is connected to a load. The absolute value of these voltages may vary depending upon the particular application.

Still referencing FIG. 1, the PFET transistor 10 is formed above a first isolated P-well 126, while the NFET transistor 12 is formed above a second isolated P-well 128. Importantly, the first and second isolated P-wells 126, 128 are electrically isolated from one another. Also depicted in illustrative example in FIG. 1 are separate biasing sources 16, 17. The biasing source 16 is operatively coupled to the first isolated P-well 126 by a first P-well tap 14. The biasing source 17 is operatively coupled to the second isolated P-well 128 by a second P-well tap 18.

Each of the biasing sources is adapted to separately and independently supply a biasing voltage in the range of +Vdd to -Vdd to each of the PFET transistor 10 and the NFET transistor 12, i.e., to the first and second isolated P-wells 126, 128, on an as-needed basis so as to modify the performance characteristics of one or more of the transistors and/or the overall CMOS circuit. For example, with respect to the PFET transistor 10, all other things being equal, application of a biasing voltage of +Vdd to the first isolated P-well 126 will reverse bias the PFET transistor 10, thereby making the PFET transistor 10 exhibit a relatively lower leakage current and operate at a relatively slower switching speed as compared to those performance metrics of the PFET transistor 10 without +Vdd body-biasing, because the PFET region 103 has more negative charges against the positive charges in P-well 126. Conversely, application of a biasing voltage of -Vdd to the first isolated P-well 126 will forward bias the PFET transistor 10, thereby making the PFET transistor 10 exhibit a relatively higher leakage current and operate at a relatively higher switching speed as compared to those performance metrics of the PFET transistor 10 without -Vdd body-biasing, because the PFET region 103 has more positive charges than the positive charges in P-well 126.

Similarly, with respect to the NFET transistor 12, all other things being equal, application of a biasing voltage of +Vdd to the second isolated P-well 128 will forward bias the NFET transistor 12, thereby making the NFET transistor 12 exhibit a relatively higher leakage current and operate at a relatively higher switching speed as compared to those performance metrics of the NFET transistor 12 without +Vdd body-biasing, because the NFET region 105 has more negative charges. Conversely, application of a biasing voltage of -Vdd to the second isolated P-well 128 will reverse bias the NFET transistor 12, thereby making the NFET transistor 12 exhibit a relatively lower leakage current and operate at a relatively slower switching speed as compared to those performance metrics of the NFET transistor 12 without –Vdd body-biasing, because the NFET region 105 has more positive charges.

Figure 3:
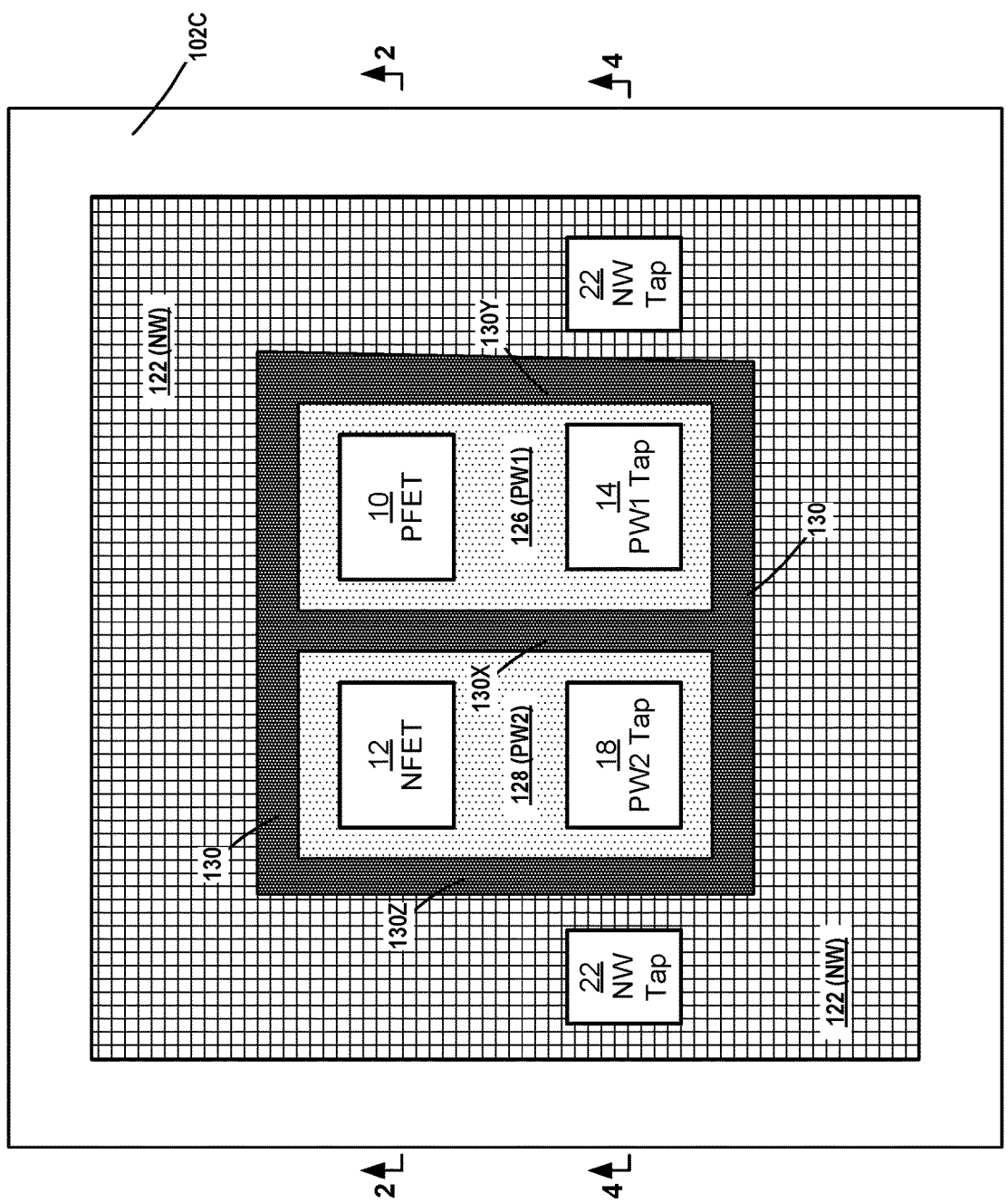
Figure 4:
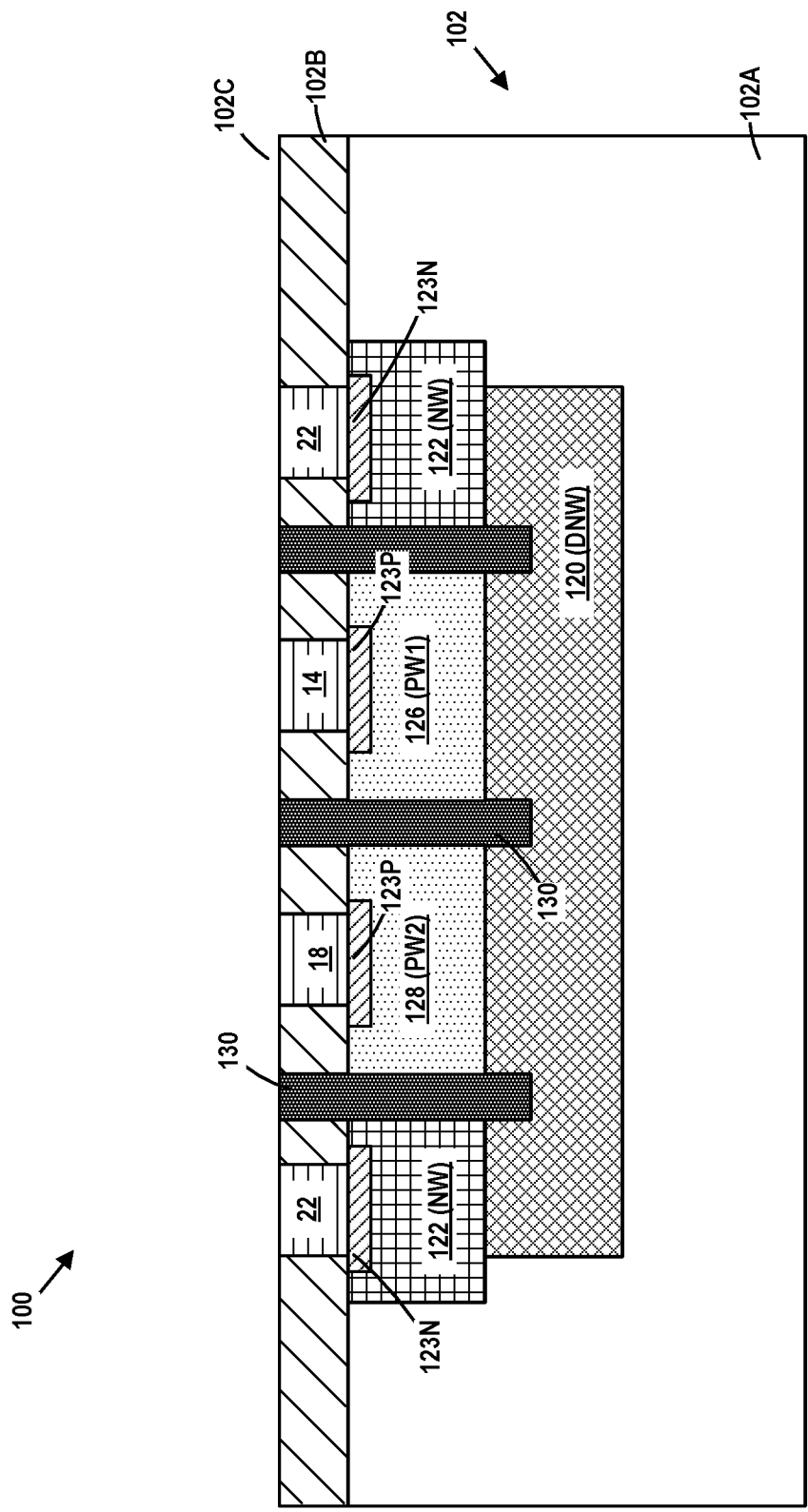

FIGS. 2-4 depict one illustrative example of a CMOS-based IC product 100 that permits independent body-biasing of each of the PFET transistor 10 and the NFET transistor 12 with a biasing voltage in the range of +Vdd to –Vdd. As noted above, the product 100 will be formed on an illustrative SOI (semiconductor-on-insulator) structure or substrate 102. In general, the SOI structure 102 comprises a base semiconductor substrate 102A, a buried insulation layer 102B (sometime referred to as a "BOX" layer when the buried insulation layer comprises silicon dioxide) positioned on the base substrate 102A and an active semiconductor layer 102C positioned on the buried insulation layer 102B. Traditionally, and in one illustrative embodiment, the base semiconductor substrate 102A may comprise silicon, the buried insulation layer 102B may comprise silicon dioxide and the active semiconductor layer 102C may comprise silicon. Of course, the base semiconductor substrate 102A and the active semiconductor layer 102C may be made of any of a variety of different semiconductor materials, and the materials for the base semiconductor substrate 102A and the active semiconductor layer 102C need not be made of the same semiconductor material in all applications, but such a situation may occur in some applications. Similarly, the buried insulation layer 102B may be comprised of a variety of different insulating materials. The thickness of the layers of the SOI substrate 102 may vary depending upon the particular application. Of course, the relative thicknesses of the active semiconductor layer 102C, the buried insulation layer 102B and the base semiconductor substrate 102A may vary depending upon the particular application. The manner in which such SOI substrates 102 are manufactured are well known to those skilled in the art.

FIG. 2 depicts one illustrative embodiment of a CMOS-based IC product 100 that includes at least one PFET transistor 10 and at least one NFET transistor 12. In this example, the transistors 10, 12 are formed side-by-side on the substrate 102. FIG. 2 is a cross-sectional view of the substrate 102 and the transistor devices 10, 12 that is taken through the transistor devices 10, 12 in the gate-length (GL) or current-transport direction of the transistor devices 10, 12. A gate width (GW) direction of the transistor devices 10, 12 is orthogonal to the gate length direction, i.e., the gate width direction extends into and out of the plane of the drawing page. The transistor devices 10, 12 referenced herein and in the attached claims are intended to be representative in nature of any type or form of PFET transistor or NFET transistor that may be formed on an integrated circuit product. In the depicted example, the transistor devices 10, 12 are depicted as planar transistor devices that are manufactured using gate-first manufacturing techniques.

With reference to FIG. 2, a deep isolation structure 130 was formed in the substrate 102 to define the isolated P-wells 126, 128 and to define the separate active regions 103, 105 in the active semiconductor layer 102C where the transistor devices 10, 12 will be formed. As shown, in the depicted example, the substrate 102 comprises a PFET region 103 (where the at least one PFET device 10 will be formed) and an NFET region 105 (where the at least one NFET device 12 will be formed). Also depicted in FIG. 2 is a deep N-well region 120 that was formed in the base semiconductor substrate 102A. Also shown in FIG. 2 are a first isolated P-well 126 and a second isolated P-well 128, both of which were formed in the base semiconductor substrate 102A below the buried insulation layer 102B. Both the first isolated P-well 126 and the second isolated P-well 128 engage the deep N-well region 120.

The first isolated P-well 126 and the second isolated P-well 128 are electrically isolated from one another. More specifically, the first isolated P-well 126 is electrically isolated, in the horizontal direction, from the second isolated P-well 128 by a first portion 130X of the deep isolation structure 130. The bottom surface 130B of the deep isolation structure 130 is positioned within the deep N-well region 120, i.e., the first portion 130X of the deep isolation structure 130 extends through the isolated P-wells 126, 128 and into the deep N-well region 120. The combination of the buried insulation layer 102B and the deep N-well region 120 vertically isolates the first isolated P-well 126 and the second isolated P-well 128.

In this particular illustrative configuration of the product 100, the first isolated P-well 126 is positioned under the PFET region 103, while the second isolated P-well 128 is positioned under the NFET region 105. Also depicted in FIG. 2 is a ring-like N-well region 122 that effectively surrounds the collective outer perimeter of the first isolated P-well 126 and the second isolated P-well 128 (when the wells 126, 128 are considered collectively). In this example, the ring-like N-well 122 is formed in the base semiconductor substrate 102A such that it engages the deep N-well region 120. A second portion 130Y of the deep isolation structure 130 is positioned laterally between a first portion of the ring-like N-well region 122 and the first isolated P-well 126, while a third portion 130Z of the deep isolation structure 130 is positioned laterally between a second portion of the ring-like N-well region 122 and the second isolated P-well 128. An upper portion 130H of the first portion 130X of the deep isolation structure 130 is positioned laterally between the PFET region 103 and the NFET region 105.

Of course, as will be appreciated by those skilled in the art after a complete reading of the present application, any desired number of PFET transistors 10 may be formed above the first isolated P-well 126 and any desired number of NFET transistors 12 may be formed above the second isolated P-well 128. For example, the first isolated P-well 126 may extend for a relatively long distance in the gate width direction of the transistor devices, i.e., into and out of the plane of the drawing page, wherein each of the separate PFET transistors may have a shallow trench isolation structure (not shown) positioned between them (in the gate width direction), i.e., such a shallow isolation structure would run in the gate length direction of the devices 10. Such an arrangement would allow the plurality of PFET transistors 10 to effectively share the first isolated P-well 126. A plurality of NFET transistors 12 could also be formed above the second isolated P-well 128 using a similar physical arrangement whereby all of the plurality of NFET transistors 12 could effectively share the second isolated P-well 128.

The exact process flow performed to produce the product 100 may vary depending upon the particular application. In general, the various doped well regions shown in the drawings may be formed by performing known ion implantation processes through one or more patterned implantation masks (not shown), e.g., one or more patterned layers of photoresist. In one illustrative process flow, the deep N-well region 120 may be initially formed in the base semiconductor substrate 102A. Thereafter, a single continuous P-well may be formed in the base semiconductor substrate 102A above the deep N-well region 120 by performing a single ion implantation process. As discussed more fully below, the formation of the deep isolation structure 130 effectively divides the single continuous P-well into the above-mentioned first isolated P-well 126 and the second isolated P-well 128. Thereafter, the above-mentioned ring-like N-well region 122 may be formed in the base semiconductor substrate 102A. If desired, the order of formation of the ring-like N-well region 122 and the single continuous P-well may be reversed.

The P-type wells or regions may be formed using a P-type dopant such as boron or boron difluoride. The N-type wells or regions may be formed using an N-type dopant such as arsenic or phosphorus. The parameters of ion implantation processes that are performed to form these various doped regions, as well as the concentration of dopant atoms in the resulting doped regions, may vary depending upon the application. In the examples in the drawings, the various doped regions will be simplistically depicted as having a generally rectangular shaped cross-sectional configuration in their as-implanted position, i.e., the approximate position of the implanted dopant atoms immediately after the conclusion of the implantation process. After a complete reading of the present application, those skilled in the art will appreciate that the dopant atoms in the various doped regions will tend to migrate from their as-implanted position due to various processing operations that are performed to complete the manufacture of the transistor devices 10, 12 after the formation of the various doped regions.

In the depicted example, in general, the deep isolation structure 130 was formed by initially forming a plurality of relatively deeper trenches 130A in the substrate 102. Thereafter, the trenches 130A were over-filled with an insulating material, e.g., silicon dioxide. Next, a CMP or etch-back process was performed to remove the excess insulating material positioned outside of the trenches 130A above the deep N-well region 120.

After formation of the various well regions and the deep isolation structure 130 in the substrate 102, the transistor devices may be fabricated. As noted above, the transistor devices 10, 12 referenced herein and in the attached claims are intended to be representative in nature. Thus, the particular form, structure or composition of the transistor devices 10, 12 and the manner in which they are made should not be considered to be a limitation with respect to any of the inventions disclosed herein. The transistor devices 10, 12 generally comprise a gate structure 107 (that includes an illustrative gate insulation layer 107A and an illustrative gate electrode structure 107B), a sidewall spacer 111 (e.g., silicon nitride), a gate cap 113 (e.g., silicon nitride) and doped source/drain regions that are generally designated with the reference numeral 115. Although only a single spacer 111 is shown in the attached drawings, those skilled in the art will appreciate that multiple sidewall spacers may be formed adjacent the gate structures 107 of the transistor devices 10, 12. Of course, the materials of construction for the PFET transistors 10 and the NFET transistors 12 may be different from one another.

The basic components of the transistor devices 10, 12, e.g., the gate structure 107, the spacer(s) 111, the gate cap 113 and the doped source/drain regions 115 may be manufactured using any of a variety of known manufacturing techniques. In the depicted example, the gate insulation layer 107A may be comprised of a variety of different materials, such as, for example, silicon dioxide, a so-called high-k (k value greater than 10) insulation material, such as, for example hafnium oxide. Similarly, the gate electrode structure 107B may comprise polysilicon and/or one or more layers of metal-containing material, such as, for example, titanium nitride, aluminum, tantalum, etc. In the example depicted herein, the doped source/drain regions 115 may be formed by performing ion implantation processes through one or more patterned implant masks by performing traditional manufacturing techniques. The doped source/drain regions 115 will be doped with a P-type dopant for the PFET devices 10, while the doped source/drain regions 115 will be doped with an N-type dopant for the NFET devices 12.

FIG. 3 is a plan view of the product 100 wherein the transistor devices 10, 12 and the P-well tap structures 14, 18 are simplistically and schematically depicted as simple rectangular shaped structures. Also shown in FIG. 3 is the first isolated P-well 126 for the at least one PFET transistor 10 and the second isolated P-well 128 for the at least one NFET transistor 12. The ring-like N-well region 122 that effectively surrounds the collection of the first isolated P-well 126 and the second isolated P-well 128 (when all of the wells 126, 128 are considered collectively) is also depicted in this drawing. Also depicted in FIG. 3 is the illustrative deep isolation structure 130.

Still referencing FIG. 3, in the depicted example, a first P-well tap 14 is conductively coupled to the first isolated P-well 126 and a second P-well tap 18 is conductively coupled to the second isolated P-well 128. The first P-well tap 14 is used to provide a biasing voltage to the first isolated P-well 126 beneath the PFET transistor 10. The second P-well tap 18 is used to provide a biasing voltage to the second isolated P-well 128 beneath the NFET transistor 12. Also depicted in FIG. 3 are two illustrative N-well tap structures 22 that are conductively coupled to the ring-like N-well region 122. The N-well tap structures 22 are used to provide a biasing voltage to the deep N-well region 120 through the ring-like N-well region 122. As indicated in FIG. 3, FIG. 2 is a cross-sectional view of the product 100 taken through the transistor devices 10, 12.

As also indicated in FIG. 3, FIG. 4 is a cross-sectional view taken through the various simplistically and schematically depicted tap structures 14, 18 and 22. The various tap structures 14, 18 and 22 are intended to be representative in nature of any type of conductive structure that may be formed to conductively contact the associated doped region. Moreover, the various tap structures 14, 18 and 22 may be of any form, they may be comprised of a variety of different materials and they may be manufactured using known manufacturing techniques. Also shown in FIG. 4 are simplistically depicted ohmic contact regions 123N, 123P (generally referenced using the numeral 123) that were formed on or in the doped wells to reduce contact resistance. The ohmic contact regions 123N, 123P may be formed by ion implantation and/or by the formation of metal silicide material.

With reference to FIG. 4, in one illustrative process flow, doped ohmic contact regions 123N, 123P were formed in the doped wells by performing ion implantation processes. The concentration of dopants in the doped ohmic contact regions 123 is typically greater than the concentration of dopants in the associated doped well region. Then, contact openings for the various tap structures 14, 18 and 22 were formed in the active layer 102C and the buried insulating material 102B so as to expose portions of the ohmic contact regions 123. Next, one or more conductive materials were formed in the contact openings for the various tap structures 14, 18 and 22, and a CMP process was performed to remove excess amounts of the conductive material positioned outside of the contact openings and above the upper surface of the active layer 102C of the substrate 102. These process operations result in the formation of the simplistically depicted tap structures 14, 18 and 22. At the point of processing depicted in FIGS. 2-4, various known processing operations may be performed to complete the fabrication of the IC product 100.

With respect to the embodiment shown above, the IC product 100 includes the deep N-well region 120 that is positioned in the base semiconductor substrate 102A, the ring-like N-well region 122 that engages the deep N-well region 120, the PFET region 103 and the NFET region 105. The product also includes the first isolated P-well 126 positioned in the base semiconductor substrate 102A below the PFET region 103, above and engaging the deep N-well region 120 and within the ring-like N-well region 122. The second isolated P-well 128 is positioned in the base semiconductor substrate 102A below the NFET region 105, above and engaging the deep N-well region 120 and within the ring-like N-well region 122. In this example, the product also includes the deep isolation structure 130 with a bottom surface 130B that is positioned within the deep N-well region 120, wherein the first portion 130X of the deep isolation structure 130 is laterally positioned between the first isolated P-well 126 and the second isolated P-well 128 so as to electrically isolate, in a horizontal direction, the first isolated P-well 126 from the second isolated P-well 128. The product also includes at least one PFET transistor 10 formed on the PFET region 103 and at least one NFET transistor 12 formed on the NFET region 105. In further embodiments, a second portion 130Y of the deep isolation structure 130 is positioned laterally between the first isolated P-well 126 and a first portion of the ring-like N-well region 122, while a third portion 130Z of the deep isolation structure 130 is positioned laterally between the second isolated P-well 128 and a second portion of the ring-like N-well region 122.

Still referencing the embodiment shown above, the product may also include the first P-well tap 14 that is conductively coupled to the first isolated P-well 126, the second P-well tap 18 that is conductively coupled to the second isolated P-well 128, a first body-biasing source 16 (see FIG. 1) that is conductively coupled to the first P-well tap 16, wherein the first body-biasing source 16 is adapted to supply a first biasing voltage to the first isolated P-well 126, and a second body-biasing source 17 (see FIG. 1) that is conductively coupled to the second P-well tap 18, wherein the second body-biasing source 17 is adapted to supply a second biasing voltage to the second isolated P-well 128. Importantly, in this embodiment, the first body-biasing source 16 is adapted to supply the first biasing voltage to the first isolated P-well 126 independently of the second body-biasing source 17 supplying the second biasing voltage to the second isolated P-well 128.

With respect to the embodiment shown above, as will be appreciated by those skilled in the art after a complete reading of the present application, the formation of the isolated first P-well 126 for the at least one PFET transistor 10 and the isolated second P-well 128 for the at least one NFET transistor 12, respectively, provide unique advantages relative to prior art IC products. First, the transistors 10, 12 may be body-biased completely independently from one another and at completely different voltage levels. In some prior art products, at least a single PFET transistor and at least a single NFET transistor were both formed above a single, common unitary P-well formed in the base substrate of an SOI structure. An outer ring-like N-well region was positioned around the common unitary P-well and an isolation structure laterally separated the common unitary P-well from the outer ring-like N-well region. This prior art configuration created a diode with the ring-like N-well region serving as one of the conductive plates of the diode and the common unitary P-well serving as the other conductive plate of the diode. Unfortunately, the biasing voltage applied to the common unitary P-well was limited to the value of Vss for the NFET transistor so as to prevent forward turn-on of the above-described diode. In contrast, due to the formation of the isolated and separate P-wells 126, 128 for the PFET transistor 10 and the NFET transistor 12, respectively, a biasing voltage in the range of +Vdd to −Vdd may be applied independently to each of the isolated and separate P-wells 126, 128 on an as-needed basis so as to modify the performance characteristics of one or more of the transistors and/or the overall CMOS circuit.

More specifically, with reference to the PFET transistor, if the objective was to cause the PFET transistor to exhibit relatively lower leakage currents (with the downside of relatively slower switching speeds) because the channel region has more reverse (opposite) type carries (electrons in the case of a PFET transistor), the biasing voltage that could be applied to the PFET device was limited from Vss to −Vdd. On the other hand, if the objective was to cause the PFET transistor to exhibit relatively higher speeds (with the downside of relatively higher leakage) because the channel region has more holes, the biasing voltage that could be applied to the PFET device was limited from +Vdd to Vss.

With respect to the NFET transistor, if the objective was to cause the NFET transistor to exhibit relatively lower leakage currents (with the downside of relatively slower switching speeds) because the channel region has more reverse (opposite) type carries (holes in the case of an NFET transistor), the biasing voltage that could be applied to the NFET device was limited from Vss to +Vdd. On the other hand, if the objective was to cause the NFET transistor to exhibit relatively higher switching speeds (with the downside of relatively higher leakage) because the channel region has more electrons, the biasing voltage that could be applied to the PFET device was limited from −Vdd to Vss.

The overall footprint of the combination of the first isolated P-well 126, the second isolated P-well 128 and the portion 130X (see FIG. 2) of the deep isolation structure 130 positioned laterally between the two P-wells 126, 128 will be less as compared to the overall footprint of prior art IC products where a doped N-well region was used to horizontally isolate back gate P-well regions. Such a prior art isolating N-well for horizontal isolation between adjacent P-wells had a relatively wider width (e.g., 200-300 nm) as compared to the width (e.g., 60-70 nm) of the portion 130X of the deep isolation structure 130. The isolating N-well region of the prior art was relatively wider because such isolating N-well regions needed a deep dopant profile to be effective which, in turn, required a relatively wide lateral width for the isolating N-well.

Figure 5:
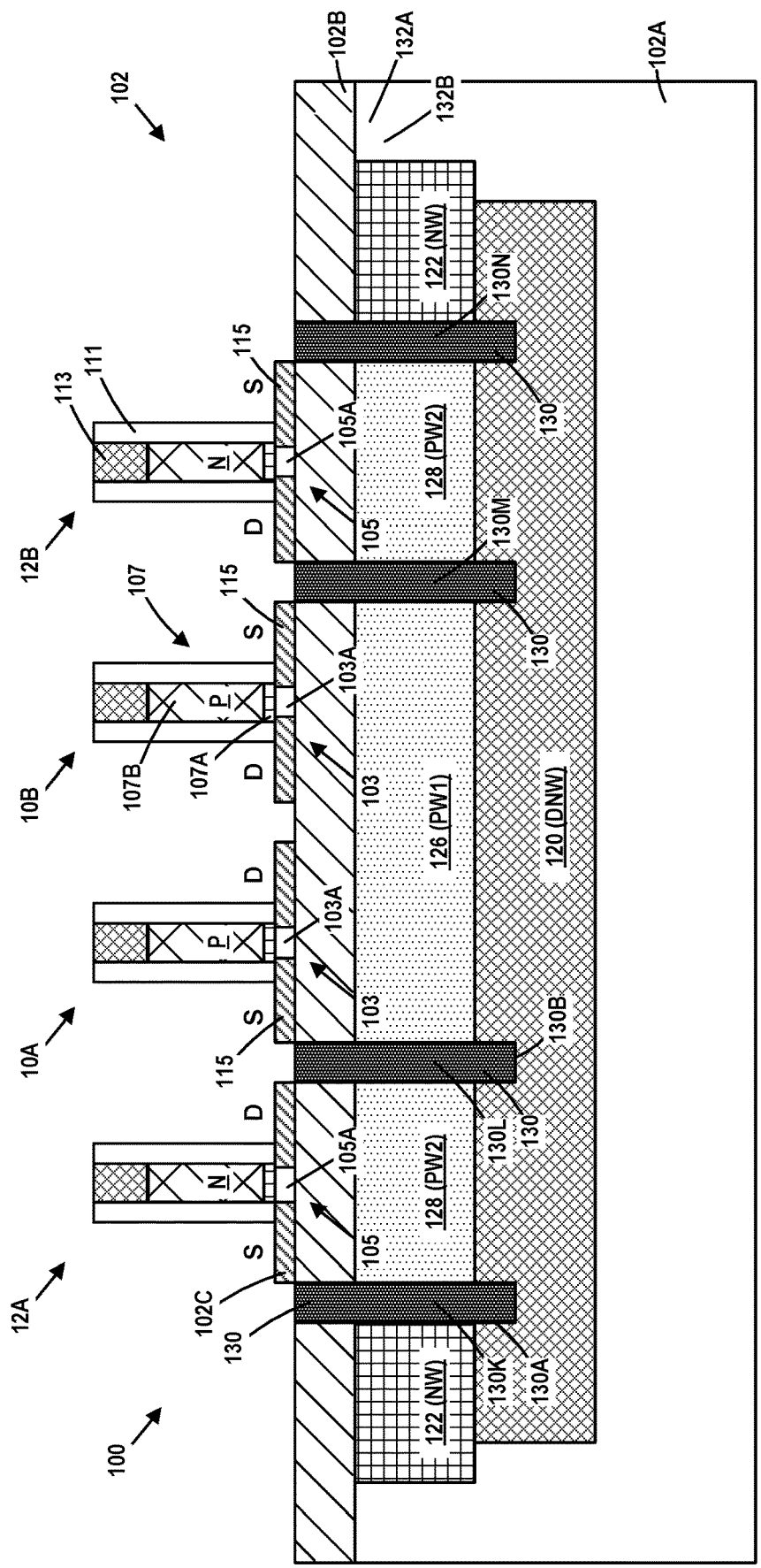
Figure 6:
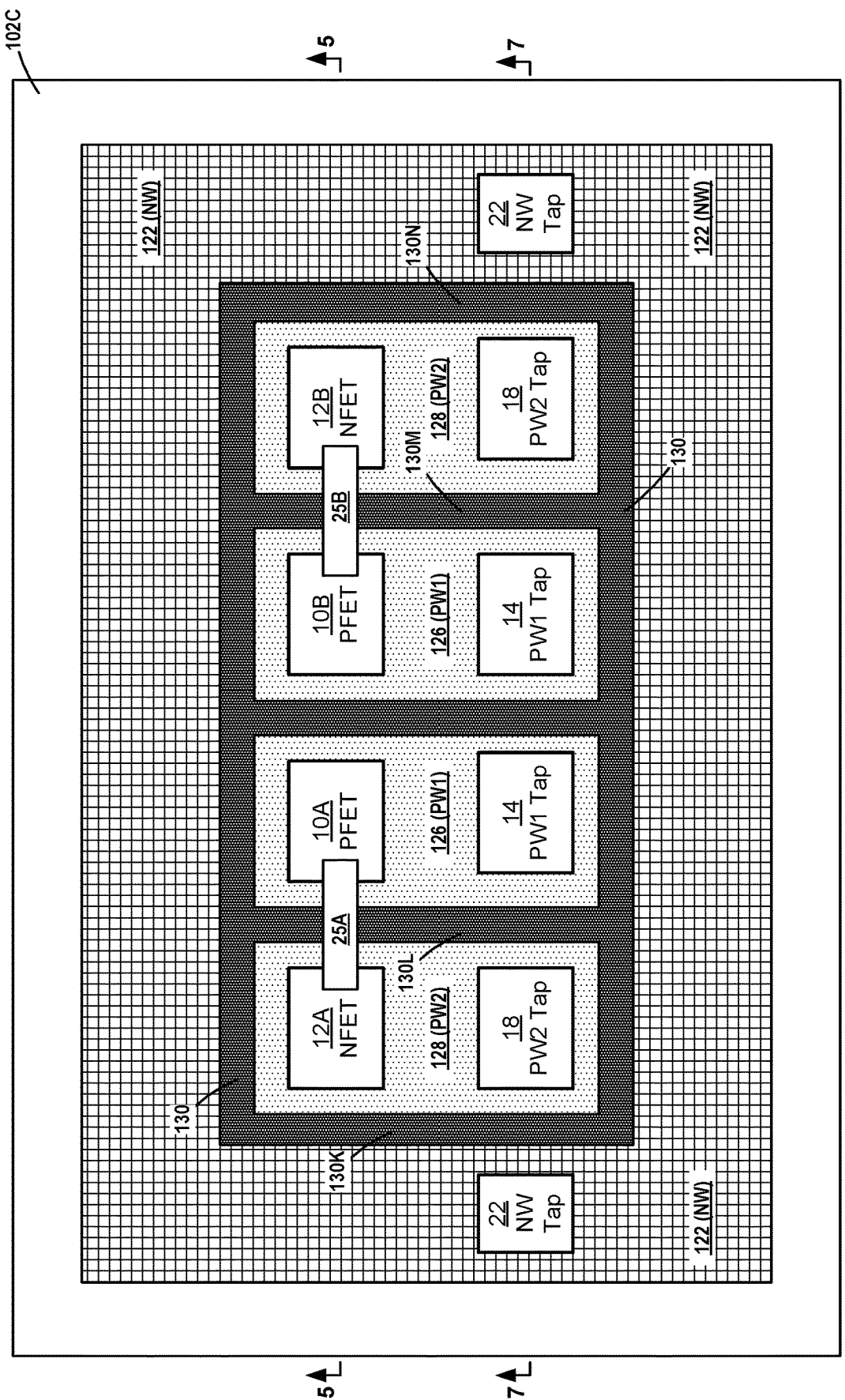
Figure 7:
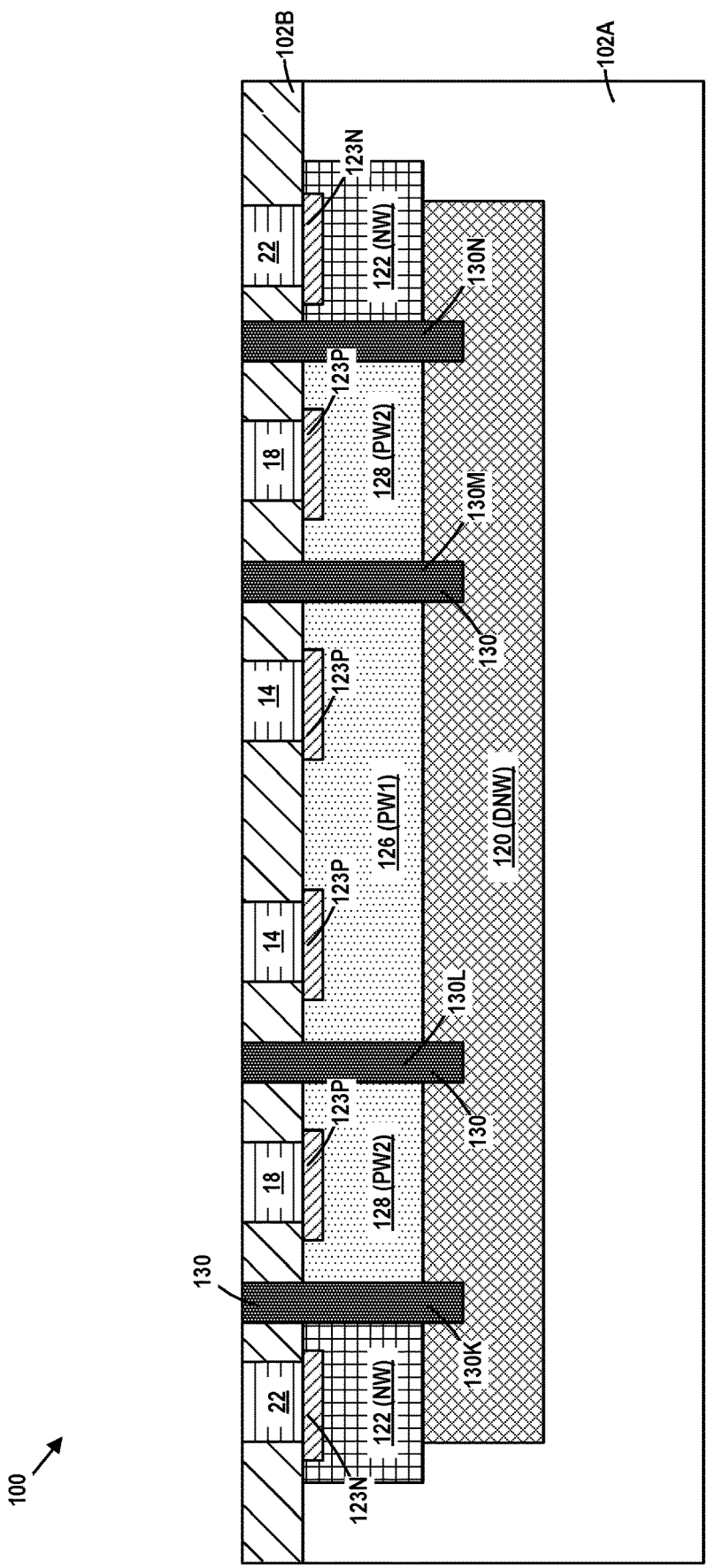

FIGS. 5-7 depict an embodiment where the novel methods disclosed herein may be employed with an IC product 100 comprised of two inverter circuits (each comprised of one PFET transistor 10 and one NFET transistor 12) positioned side-by-side on the substrate 102 (reference labels 10A/B and 12A/B have been added for the transistor devices 10, 12). FIG. 5 is a cross-sectional view of the substrate 102 and the transistor devices 10, 12 that is taken through the transistor devices 10, 12 in the gate-length (GL) direction of the transistor devices 10, 12.

FIG. 5 depicts the product 100 after the deep isolation structure 130 was formed in the substrate 102 to define two separate PFET regions 103 and two separate NFET regions 105 in the active semiconductor layer 102C where the transistor devices 10, 12 will be formed. The spaces between the spaced-apart active regions 103, 105 will eventually be filled with an insulating material, e.g., silicon dioxide. Also depicted in FIG. 5 is the above-described deep N-well region 120, a first isolated P-well 126 and two second isolated P-wells 128 (one of which may be considered to be a third isolated P-well) that were also formed in the base semiconductor substrate 102A above and engaging the deep N-well region 120. The first isolated P-well 126 is electrically isolated, in the horizontal direction, from both of the two second isolated P-wells 128 by the deep isolation structure 130. More specifically, in this particular configuration of the product 100, a first portion 130L of the deep isolation structure 130 is positioned laterally between the first isolated P-well 126 and the second isolated P-well 128 on the left, while a second portion 130M of the deep isolation structure 130 is positioned laterally between the first isolated P-well 126 and the second isolated P-well 128 on the right. Additionally, another portion 130K of the deep isolation structure 130 is positioned laterally between a portion of the ring-like N-well region 122 and the second isolated P-well 128 on the left, while yet another portion 130N of the deep isolation structure 130 is positioned between the second isolated P-well 128 on the right and the ring-like N-well region 122. As before, the bottom 130B of the deep isolation structure 130 extends into and is positioned within the deep N-well region 120. In this particular example, the first isolated P-well 126 is positioned under both of the PFET regions 103, while one of the second isolated P-wells 128 is positioned under each of the NFET regions 105. As before, the combination of the buried insulation layer 102B and the deep N-well 120 vertically isolates the first isolated P-well 126 and the two second isolated P-wells 128. Also depicted in FIG. 5 is the above-described ring-like N-well 122 that engages the deep N-well region 120 and effectively surrounds the collective outer perimeter of the first isolated P-well 126 and the two second isolated P-wells 128 (when the wells 126, 128 are considered collectively).

As with the previous embodiment, the exact process flow performed to produce the product 100 shown in FIGS. 5-7 may vary depending upon the particular application. More specifically, the various well regions depicted in FIG. 5 may be formed as described above. In one illustrative process flow, a single continuous P-well may be formed above the deep N-well 120 by performing a single ion implantation process. As discussed more fully below, the formation of the deep isolation structure 130 effectively divides the single continuous P-well into the above-mentioned first isolated P-well 126 and the two second isolated P-wells 128. Thereafter, the above-mentioned ring-like N-well 122 may be formed in the substrate 102. If desired, the order of formation of the ring-like N-well 122 and the single continuous P-well may be reversed.

In the depicted example, in general, the deep isolation structure 130 was formed by initially forming a plurality of relatively deeper trenches 130A in the substrate 102. Thereafter, the trenches 130A were over-filled with an insulating material, e.g., silicon dioxide. Next, a CMP or etch-back process was performed to remove the excess insulating material positioned outside of the trenches 130A.

FIG. 6 is a plan view of the product 100 wherein the transistor devices 10, 12 and the P-well tap structures 14, 18 are simplistically and schematically depicted as simple rectangular shaped structures. Also shown in FIG. 5 is the first isolated P-well 126 shared by both of the PFET transistors 10. A second isolated P-well 128 is provided under each of the two NFET transistors 12. The ring-like N-well region 122 that effectively surrounds the collection of the first isolated P-well 126 and the second isolated P-wells 128 (when all of the wells are considered collectively) is also depicted in this drawing.

As shown in FIG. 6, in the illustrative case where the product 100 includes a pair of inverter circuits (e.g., an illustrative SRAM circuit), the product 100 includes representative and schematically depicted conductive structures 25A, 25B (collectively referenced using the numeral 25). The conductive structure 25A conductively couples the drain region of the NFET transistor 12A to the drain region of the PFET transistor 10A. Similarly, the conductive structure 25B conductively couples the drain region of the NFET transistor 12B to the drain region of the PFET transistor 10B. The conductive structures 25 may be of any form, they may be comprised of a variety of different materials and they may be manufactured using known manufacturing techniques. No attempt has been made to show the conductive structures 25 in any of the other drawings so as not to overly complicate the presentation of the subject matter disclosed herein.

Still referencing FIG. 6, in the depicted example, the two PFET transistors 10 effectively share the first isolated P-well 126. In the example depicted herein, each of two illustrative P-well taps 14 is conductively coupled to the first isolated P-well 126. In practice, only a single P-well tap 14 may be needed to establish electrical connection with the first isolated P-well 126 that is shared by both of the PFET transistors 10. As before, the first P-well tap(s) 14 is used to provide a biasing voltage to the first isolated P-well 126 beneath the two PFET transistors 10. One of the second P-well taps 18 is used to provide a biasing voltage to the second isolated P-well 128 positioned beneath the NFET transistor 12A. The other of the second P-well taps 18 is used to provide a biasing voltage to the second isolated P-well 128 positioned beneath the NFET transistor 12B. Also depicted in FIG. 6 are two illustrative N-well tap structures 22 that are conductively coupled to the ring-like N-well region 122. The N-well tap structures 22 are used to provide a biasing voltage to the deep N-well region 120 through the ring-like N-well region 122. As indicated in FIG. 6, FIG. 5 is a cross-sectional view of the product 100 taken through the transistor devices 10, 12.

As indicated in FIG. 6, FIG. 7 is a cross-sectional view taken through the various simplistically depicted tap structures 14, 18 and 22. The various tap structures 14, 18 and 22 are intended to be representative in nature of any type of conductive structure that may be formed to conductively contact the associated doped region. Moreover, the various tap structures 14, 18 and 22 may be of any form, they may be comprised of a variety of different materials and they may be manufactured using known manufacturing techniques. Also depicted in FIG. 7 are the illustrative ohmic tap regions 123.

With respect to the illustrative embodiment of the product 100 shown in FIGS. 5-7, the deep isolation structure 130 (with a bottom surface 130B positioned within the deep N-well region 120) includes a first portion 130L that is positioned laterally between the first isolated P-well 126 and the second isolated P-well 128 on the left, and a second portion 130M that is positioned laterally between the first isolated P-well 126 and the second isolated P-well 128 on the right (which may also be referred to as a third isolated P-well), wherein the first isolated P-well 126 is electrically isolated, in a horizontal direction, from both of the second isolated P-wells 128.

The transistors 10, 12 shown in this embodiment may also be independently body-biased as described above with respect to the previous embodiment. For example, a first body-biasing source 16 (see FIG. 1) may be conductively coupled to the first P-well tap(s) 14 so as to supply a first biasing voltage to the first isolated P-well 126 so as to apply the first biasing voltage to the first and second PFET transistors 10A, 10B at the same time. Similarly, at least one second body-biasing source 17 (see FIG. 1) may be conductively coupled to one or both of the P-well taps 18 so as to supply a second biasing voltage to at least one of the two second isolated P-wells 128 (and perhaps to both at the same or different times), wherein the biasing of the first isolated P-well 126 and one or both of the second isolated P-wells 128 are adapted to be performed independently of one another.

With respect to the embodiment shown above, as will be appreciated by those skilled in the art after a complete reading of the present application, the formation of the isolated first P-well 126 for the at least one PFET transistor 10 and the isolated second P-well 128 for the at least one NFET transistor 12, respectively, provide unique advantages relative to prior art IC products. First, the transistors 10, 12 may be body-biased completely independently from one another and at completely different voltage levels. As noted above, in some prior art products, at least a single PFET transistor and at least a single NFET transistor were both formed above a single, common unitary P-well formed in the base substrate of an SOI structure. An outer ring-like N-well region was positioned around the common unitary P-well and an isolation structure laterally separated the common unitary P-well and the outer ring-like N-well region. This prior art configuration created the above-describe diode with the ring-like N-well region serving as one of the conductive plates of the diode and the common unitary P-well serving as the other conductive plate of the diode. Unfortunately, the biasing voltage applied to the common unitary P-well was limited to the value of Vss for the NFET transistor so as to prevent forward turn-on of the above-described diode. In contrast, due to the formation of the isolated and separate P-wells 126, 128 for the PFET transistor 10 and the NFET transistor 12, respectively, a biasing voltage in the range of +Vdd to −Vdd may be applied independently to each of the isolated and separate P-wells 126, 128 on an as-needed basis so as to modify the performance characteristics of one or more of the transistors and/or the overall CMOS circuit. The comments above with respect to independently body-biasing the individual PFET and NFET transistors apply equally with respect to the embodiment of the product shown in FIGS. 5-7.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a base semiconductor substrate;
   a buried insulation layer positioned above the base semiconductor substrate;
   an active semiconductor layer positioned above the buried insulation layer;
   a PFET region defined in the active semiconductor layer;
   an NFET region defined in the active semiconductor layer;
   a deep N-well region positioned in the base semiconductor substrate;
   a first isolated P-well positioned in the base semiconductor substrate below the PFET region, the first isolated P-well engaging the deep N-well region;
   a second isolated P-well positioned in the base semiconductor substrate below the NFET region, the second isolated P-well engaging the deep N-well region;
   a deep isolation structure, the deep isolation structure comprising a bottom surface that is positioned within the deep N-well region, a first portion of the deep isolation structure being laterally positioned between the first isolated P-well and the second isolated P-well to electrically isolate, in a horizontal direction, the first isolated P-well from the second isolated P-well;
   at least one PFET transistor formed on the PFET region and above the first isolated P-well; and
   at least one NFET transistor formed on the NFET region and above the second isolated P-well.

2. The integrated circuit product of claim 1, wherein the at least one PFET transistor consists of a single PFET transistor and wherein the at least one NFET transistor consists of a single NFET transistor.

3. The integrated circuit product of claim 1, wherein the deep isolation structure comprises silicon dioxide.

4. The integrated circuit product of claim 1, further comprising a ring-like N-well region positioned in the base semiconductor substrate and around an outer perimeter of the first and second isolated P-wells, when the first and second isolated P-wells are considered collectively, the ring-like N-well region engaging the deep N-well region.

5. The integrated circuit product of claim 1, further comprising:
   a first P-well tap that is conductively coupled to the first isolated P-well;
   a second P-well tap that is conductively coupled to the second isolated P-well;
   a first body-biasing source that is conductively coupled to the first P-well tap, wherein the first body-biasing source is adapted to supply a first biasing voltage to the first isolated P-well; and
   a second body-biasing source that is conductively coupled to the second P-well tap, wherein the second body-biasing source is adapted to supply a second biasing voltage to the second isolated P-well, wherein the first body-biasing source is adapted to supply the first biasing voltage to the first isolated P-well independently of the second body-biasing source supplying the second biasing voltage to the second isolated P-well.

6. An integrated circuit product, comprising:
   a base semiconductor substrate;
   a buried insulation layer positioned above the base semiconductor substrate;
   an active semiconductor layer positioned above the buried insulation layer;
   a deep N-well region positioned in the base semiconductor substrate;

a ring-like N-well region positioned in the base semiconductor substrate, the ring-like N-well region engaging the deep N-well region;
a PFET region defined in the active semiconductor layer;
an NFET region defined in the active semiconductor layer;
a first isolated P-well positioned in the base semiconductor substrate below the PFET region, above the deep N-well region and within the ring-like N-well region, the first isolated P-well engaging the deep N-well region;
a second isolated P-well positioned in the base semiconductor substrate below the NFET region, above the deep N-well region and within the ring-like N-well region, the second isolated P-well engaging the deep N-well region;
a deep isolation structure, the deep isolation structure comprising a bottom surface that is positioned within the deep N-well region, a first portion of the deep isolation structure being laterally positioned between the first isolated P-well and the second isolated P-well so as to electrically isolate, in a horizontal direction, the first isolated P-well from the second isolated P-well;
at least one PFET transistor formed on the PFET region and above the first isolated P-well; and
at least one NFET transistor formed on the NFET region and above the second isolated P-well.

7. The integrated circuit product of claim 6, further comprising:
a second portion of the deep isolation structure being positioned laterally between the first isolated P-well and a first portion of the ring-like N-well region; and
a third portion of the deep isolation structure being positioned laterally between the second isolated P-well and a second portion of the ring-like N-well region.

8. The integrated circuit product of claim 6, wherein the deep isolation structure comprises silicon dioxide.

9. The integrated circuit product of claim 6, wherein the ring-like N-well region is positioned around an outer perimeter of the first and second isolated P-wells, when the first and second isolated P-wells are considered collectively.

10. The integrated circuit product of claim 6, further comprising:
a first P-well tap that is conductively coupled to the first isolated P-well;
a second P-well tap that is conductively coupled to the second isolated P-well;
a first body-biasing source that is conductively coupled to the first P-well tap, wherein the first body-biasing source is adapted to supply a first biasing voltage to the first isolated P-well; and
a second body-biasing source that is conductively coupled to the second P-well tap, wherein the second body-biasing source is adapted to supply a second biasing voltage to the second isolated P-well, wherein the first body-biasing source is adapted to supply the first biasing voltage to the first isolated P-well independently of the second body-biasing source supplying the second biasing voltage to the second isolated P-well.

11. The integrated circuit product of claim 10, wherein a source region of the at least one PFET transistor is conductively coupled to a PFET source voltage equal to Vdd and wherein the first body-biasing source is adapted to supply a first biasing voltage that ranges from +Vdd to −Vdd to the first isolated P-well, and wherein a source region of the at least one NFET transistor is conductively coupled to an NFET source voltage of Vss or ground, and wherein the second body-biasing source is adapted to supply a second biasing voltage that ranges from +Vdd to −Vdd to the second isolated P-well.

12. The integrated circuit product of claim 10, further comprising at least one N-well tap structure that is conductively coupled to the ring-like N-well region, wherein a biasing voltage may be supplied to the deep N-well region by applying a biasing voltage to the at least one N-well tap structure.

13. The integrated circuit product of claim 6, wherein the at least one PFET transistor and the at least one NFET transistor are planar transistor devices, wherein a PFET gate structure of the at least one PFET transistor comprises a first gate insulation layer that comprises at least one of silicon dioxide or a high-k (k value greater than 10) insulation material and a first gate electrode structure that comprises at least one of polysilicon, a metal, titanium nitride, aluminum or tantalum, and wherein an NFET gate structure of the at least one NFET transistor comprises a second gate insulation layer that comprises at least one of silicon dioxide or a high-k (k value greater than 10) insulation material and a second gate electrode structure that comprises at least one of polysilicon, a metal, titanium nitride, aluminum or tantalum.

14. The integrated circuit product of claim 6, wherein the at least one PFET transistor consists of a single PFET transistor and wherein the at least one NFET transistor consists of a single NFET transistor.

15. An integrated circuit product, comprising:
a base semiconductor substrate;
a buried insulation layer positioned above the base semiconductor substrate;
an active semiconductor layer positioned above the buried insulation layer;
a deep N-well region positioned in the base semiconductor substrate;
a ring-like N-well region positioned in the base semiconductor substrate, the ring-like N-well region engaging the deep N-well region;
a PFET region defined in the active semiconductor layer;
an NFET region defined in the active semiconductor layer;
a first isolated P-well positioned in the base semiconductor substrate below the PFET region, above the deep N-well region and within the ring-like N-well region, the first isolated P-well engaging the deep N-well region;
a second isolated P-well positioned in the base semiconductor substrate below the NFET region, above the deep N-well region and within the ring-like N-well region, the second isolated P-well engaging the deep N-well region;
a deep isolation structure, the deep isolation structure comprising a bottom surface that is positioned within the deep N-well region and first, second and third portions, wherein the first portion of the deep isolation structure is laterally positioned between the first isolated P-well, the second portion of the deep isolation structure is laterally positioned between the first isolated P-well and the ring-like N-well region and the third portion of the deep isolation structure are laterally positioned between the second isolated P-well and the ring-like N-well region;
a single PFET transistor formed on the PFET region and above the first isolated P-well; and
a single NFET transistor formed on the NFET region and above the second isolated P-well.

16. The integrated circuit product of claim 15, wherein the ring-like N-well region is positioned around an outer perimeter of the first and second isolated P-wells, when the first and second isolated P-wells are considered collectively.

17. The integrated circuit product of claim 15, further comprising: a first P-well tap that is conductively coupled to the first isolated P-well; a second P-well tap that is conductively coupled to the second isolated P-well; a first body-biasing source that is conductively coupled to the first P-well tap, wherein the first body-biasing source is adapted to supply a first biasing voltage to the first isolated P-well; and a second body-biasing source that is conductively coupled to the second P-well tap, wherein the second body-biasing source is adapted to supply a second biasing voltage to the second isolated P-well, wherein the first body-biasing source is adapted to supply the first biasing voltage to the first isolated P-well independently of the second body-biasing source supplying the second biasing voltage to the second isolated P-well.

18. The integrated circuit product of claim 15, further comprising at least one N-well tap structure that is conductively coupled to the ring-like N-well region, wherein a biasing voltage may be supplied to the deep N-well region by applying a biasing voltage to the at least one N-well tap structure.

* * * * *